(12) United States Patent
Lim et al.

(10) Patent No.: US 8,963,877 B2
(45) Date of Patent: Feb. 24, 2015

(54) TOUCH WINDOW

(75) Inventors: Dong Kyoung Lim, Seoul (KR); Yong Jin Lee, Seoul (KR); Young Jin Noh, Seoul (KR); Bong Jun Park, Seoul (KR); Jin Bok Chang, Seoul (KR); Dong Min Kim, Seoul (KR); Chang Ken Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/481,314

(22) Filed: May 25, 2012
(Under 37 CFR 1.47)

(65) Prior Publication Data
US 2013/0140061 A1 Jun. 6, 2013

(30) Foreign Application Priority Data
May 26, 2011 (KR) .................. 10-2011-0050351

(51) Int. Cl.
*G09G 5/00* (2006.01)
*H05K 1/03* (2006.01)
*G06F 3/044* (2006.01)

(52) U.S. Cl.
CPC . *H05K 1/03* (2013.01); *G06F 3/044* (2013.01)
USPC ........................................ 345/174; 178/18.06

(58) Field of Classification Search
CPC ..... G06F 3/041; G06F 3/0412; G06F 3/0414; G06F 3/042–3/047; G06F 2203/0411; G06F 2203/0412; G06F 2203/04103; H05K 1/03
USPC ...................... 345/173, 174; 174/71 R, 72 R; 178/18.01, 18.06
See application file for complete search history.

(56) References Cited

U.S. PATENT DOCUMENTS

| 2007/0257894 | A1* | 11/2007 | Philipp ................... 345/173 |
| 2008/0142281 | A1* | 6/2008 | Geaghan ................ 178/18.06 |
| 2009/0128518 | A1* | 5/2009 | Kinoshita et al. ........ 345/174 |
| 2009/0213090 | A1* | 8/2009 | Mamba et al. ........... 345/174 |
| 2009/0256817 | A1* | 10/2009 | Perlin et al. ............. 345/174 |
| 2010/0044122 | A1* | 2/2010 | Sleeman et al. ......... 178/18.06 |
| 2010/0060602 | A1* | 3/2010 | Agari et al. ............. 345/173 |
| 2010/0214260 | A1* | 8/2010 | Tanaka et al. ........... 345/174 |
| 2010/0253651 | A1* | 10/2010 | Day ....................... 345/175 |
| 2010/0271330 | A1* | 10/2010 | Philipp .................... 345/174 |

(Continued)

FOREIGN PATENT DOCUMENTS

CN 10-1782819 A 7/2010
JP 2004-086626 A 3/2004

(Continued)

OTHER PUBLICATIONS

Office Action dated May 6, 2014 in Taiwanese Office Action 101117515.

(Continued)

*Primary Examiner* — Tom Sheng
(74) *Attorney, Agent, or Firm* — Saliwanchik, Lloyd & Eisenschenk

(57) ABSTRACT

Disclosed are a technology capable of improving printing properties and a structure of a touch window manufactured by the same. The touch window according to the present invention comprises: a sensing electrode pattern layer formed on a transparent window and including sensing electrodes which are patterned; and wiring parts connected to the sensing electrodes, wherein the touch window further comprises dummy circuit patterns spaced apart from the wiring parts.

17 Claims, 7 Drawing Sheets

(56) References Cited

U.S. PATENT DOCUMENTS

| | | | |
|---|---|---|---|
| 2010/0301879 A1* | 12/2010 | Philipp | 324/679 |
| 2010/0309167 A1* | 12/2010 | Nam | 345/174 |
| 2011/0007030 A1* | 1/2011 | Mo et al. | 345/174 |
| 2011/0018838 A1* | 1/2011 | Lee | 345/174 |
| 2011/0018841 A1* | 1/2011 | Hristov | 345/174 |
| 2011/0025636 A1* | 2/2011 | Ryu et al. | 345/173 |
| 2011/0095990 A1* | 4/2011 | Philipp et al. | 345/173 |
| 2011/0109579 A1* | 5/2011 | Wang et al. | 345/173 |
| 2011/0132670 A1* | 6/2011 | Yeh et al. | 178/18.06 |
| 2011/0134073 A1* | 6/2011 | Ahn | 345/174 |
| 2011/0141042 A1* | 6/2011 | Kim et al. | 345/173 |
| 2011/0157082 A1* | 6/2011 | Lin et al. | 345/174 |
| 2011/0242027 A1* | 10/2011 | Chang | 345/173 |
| 2011/0290547 A1* | 12/2011 | Chen et al. | 174/261 |
| 2011/0290631 A1* | 12/2011 | Kuriki | 200/600 |
| 2012/0033168 A1* | 2/2012 | Hwang et al. | 349/139 |
| 2012/0062469 A1* | 3/2012 | Guard | 345/173 |
| 2012/0176323 A1* | 7/2012 | Cho | 345/173 |
| 2012/0327021 A1* | 12/2012 | Ryu et al. | 345/174 |
| 2013/0021296 A1* | 1/2013 | Min et al. | 345/174 |

FOREIGN PATENT DOCUMENTS

| | | |
|---|---|---|
| JP | 2010-257178 A | 11/2010 |
| KR | 10-2010-0084255 A | 7/2010 |
| KR | 10-2011-0045800 A | 5/2011 |
| TW | 2009-01014 A | 1/2009 |
| TW | 2011-04540 A | 2/2011 |
| WO | WO-2010/013679 A1 | 2/2010 |

OTHER PUBLICATIONS

Office Action dated Sep. 30, 2014 in Chinese Office Action 201210169867.

\* cited by examiner

TOUCH WINDOW

CROSS-REFERENCE TO RELATED APPLICATION

This application claims the benefit under 35 U.S.C. §119 of Korean Patent Application No. 10-2011-0050351, filed May 26, 2011, which is hereby incorporated by reference in its entirety.

BACKGROUND

1. Field of the Invention

The present invention relates to a technology capable of improving printing properties of a wiring pattern, and a structure of a touch window manufactured by the same.

2. Description of the Related Arts

A touch window is a device that is installed on a display surface of an image display device such as a cathode ray tube (CRT), a liquid crystal display (LCD) device, a field emission display (FED) device, a plasma display panel (PDP) and an electro luminescence device (ELD) so that the user inputs predetermined information into a computer by applying pressure to the touch window (panel) while showing the image display device.

FIG. 1 is a plane view illustrating a bonded structure of a touch window having a multi-layered structure. Referring to the illustrated drawing, a touch panel generally has a stacked structure comprising: an upper OCA below a transparent window; an upper electrode (ITO) therebelow, a lower OCA therebelow; and a lower electrode therebelow. The touch panel having such a structure is configured such that one wiring 41 is connected to one pattern of an upper electrode 40, and another one wiring 42 is also connected to other upper electrode disposed below the pattern. Furthermore, a single wiring 21 is connected to a lower electrode 20. Each connection pad (P) is formed at ends of each wiring parts.

FIG. 2 is a diagram illustrating one exemplary embodiment of the wiring part. The wiring part is generally formed of (a) which presents wirings (a first wiring) connected to a sensing electrode and routed to a lower part, and (b) which presents wirings (a second wiring) wherein a direction of the first wiring is changed by 90 degrees. A connection pad (P) is formed at the end of the second wiring part. The wiring part may be implemented by a printing method as illustrated in FIG. 3. When the wiring part is formed by the printing method, in wiring sections (i.e. outermost angle parts: a1~a3) where the printing is performed at first in a proceed direction (X) of printing, a defect such as an increase in line width of the printing wirings during a printing process, in which a blanket that cuts out an ink from a pattern roll proceeds to a stage, is frequently generated. That is, a printing defect of the initial wiring line width is generated by a frictional force generated by friction of the pattern roll and an initial printing surface, and a minute error in printing time due to the frictional force. The increase in line width has resulted in a shot defect or a problem that the level in emotional quality of printing of the entire wiring pattern is deteriorated.

BRIEF SUMMARY

An aspect of the present invention is directed to provide a touch window capable of solving the aforementioned problems.

Another aspect of the present invention is directed to provide a structure of a touch window in which a dummy pattern is designed and inserted to a wiring pattern before the printing of a wiring pattern is performed, thereby inhibiting an increase in line width of a printing section of an initial wiring and improving emotional quality of printing.

Exemplary Embodiments of the present invention is directed to provide a touch window comprising: a sensing electrode pattern layer formed on a transparent window and including sensing electrodes which are patterned; and wiring parts connected to the sensing electrodes, wherein the touch window further comprises dummy circuit patterns spaced apart from the wiring parts.

In accordance with exemplary embodiments, the present invention is advantageous that a dummy pattern is implemented at an outer angle of a wiring pattern connected to a sensing electrode of a touch window so that an increase in line width due to a printing defect generated at a first line of an outmost angle of a wiring part and a shot defect due to the increase in line width are removed, thereby being capable of improving printing quality.

BRIEF DESCRIPTION OF THE DRAWINGS

The above and other aspects, features and advantages of certain exemplary embodiments of the present invention will be more apparent from the following description taken in conjunction with the accompanying drawings, in which.

DETAILED DESCRIPTION

Figure 1:
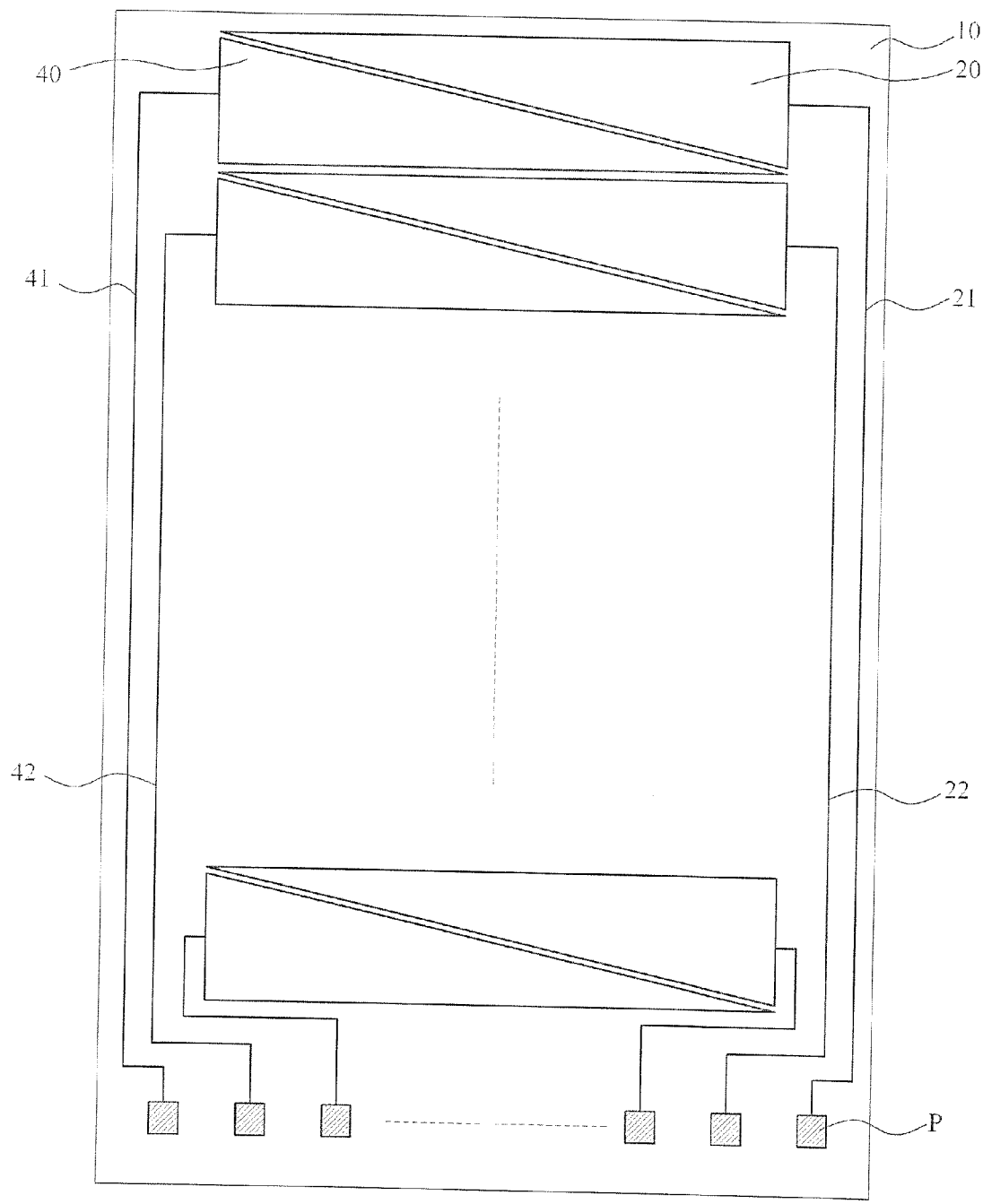
FIG. 1 is a concept view illustrating an inner structure of a conventional touch window.

Exemplary embodiments according to the present invention will now be described more fully hereinafter with reference to the accompanying drawings. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

Figure 4:
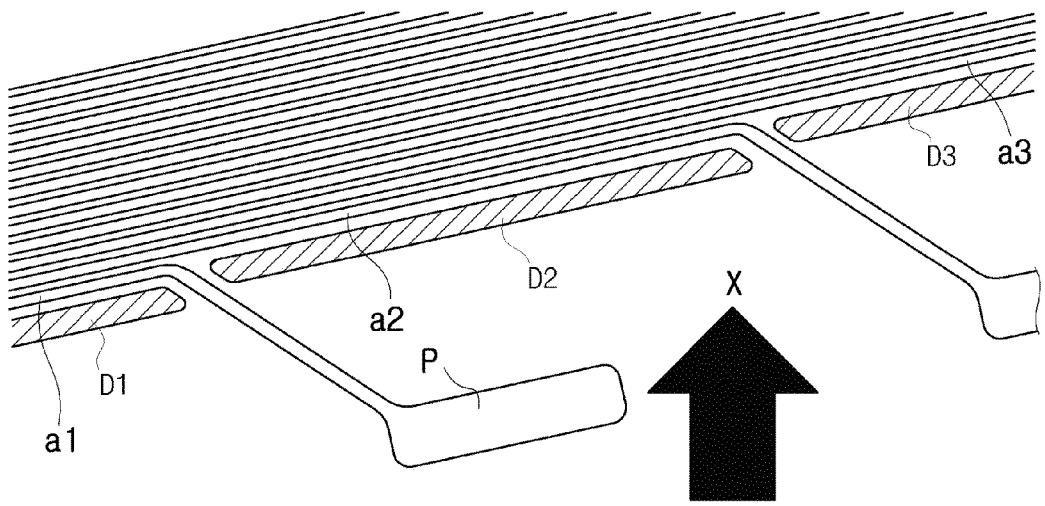
FIGS. 4 and 5 are concept views of the subject matters illustrating a structure of a dummy circuit pattern according to the present invention.

FIG. 4 is a concept view of the subject matters illustrating characteristic subject matters according to the present invention.

Referring to the illustrated drawing, a touch window according to the present invention comprises: a sensing electrode pattern layer formed on a transparent window and including sensing electrodes which are patterned; and wiring parts connected to the sensing electrodes, wherein the touch window further comprises dummy circuit patterns D1, D2 and D3 spaced apart from the wiring parts.

Specifically, as illustrated, the dummy circuit patterns D1, D2 and D3 according to the present invention may be disposed at a position spaced apart from each other to be adjacent to the nearest first printing patterns a1, a2 and a3 in the process direction X of a pattern roll for forming printing of the wiring part. That is, the first printing patterns in a printing direction usually correspond to the wiring parts of an outermost angle. As a result of the existence of the dummy circuit patterns D1, D2 and D3, a defect problem due to an increase in line width of first printing wirings generated at the time of printing of the wiring pattern can be solved. This functions to print fine wirings to be clearer and to have reliability.

Figure 2:
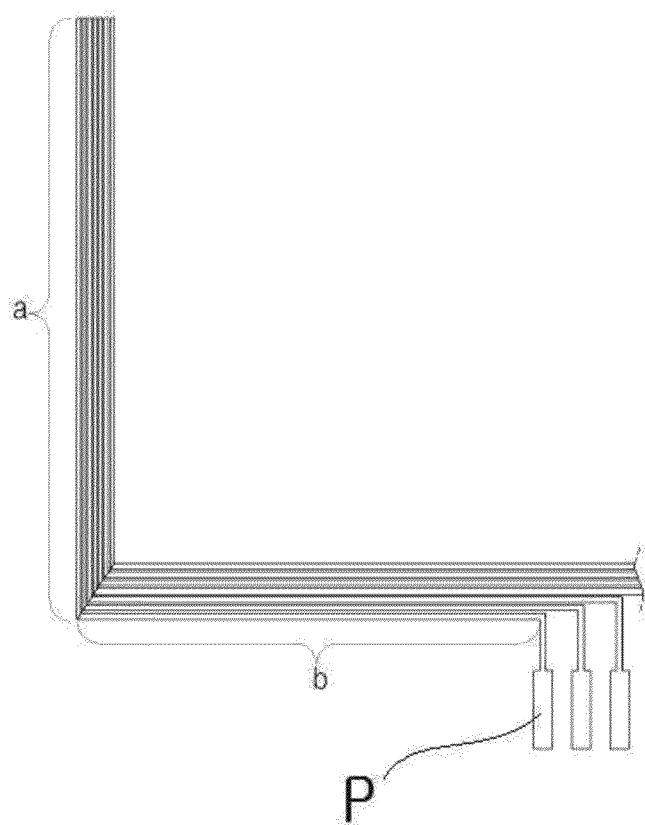
FIGS. 2 and 3 are concept views of the subject matters illustrating a structure of a wiring part of the convention touch window.
Figure 3:
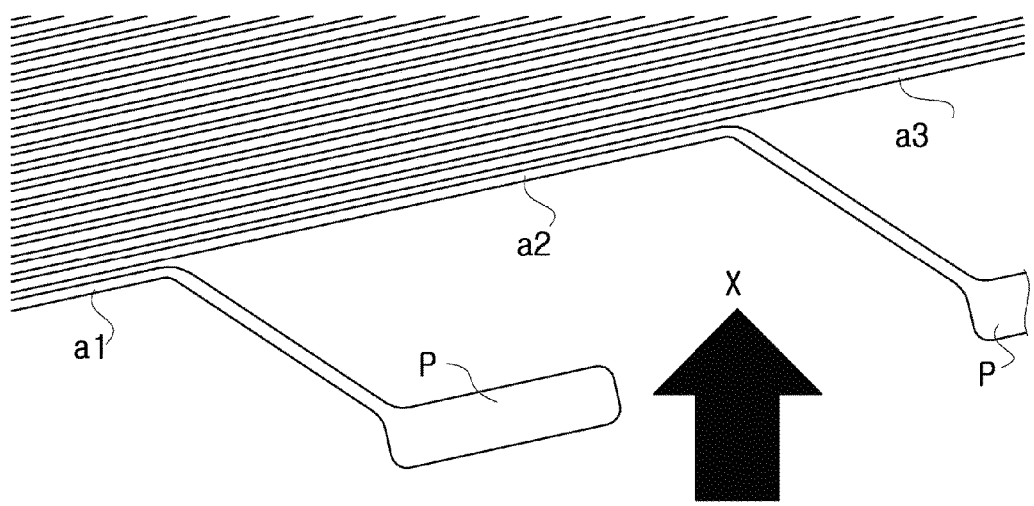

As illustrated in FIG. 4, at least two or more dummy circuit patterns D1, D2 and D3 may be disposed and formed along the longitudinal direction of a second wiring in FIG. 2, and may be further formed at a bending position of the second wiring between connection pads P.

Figure 5:
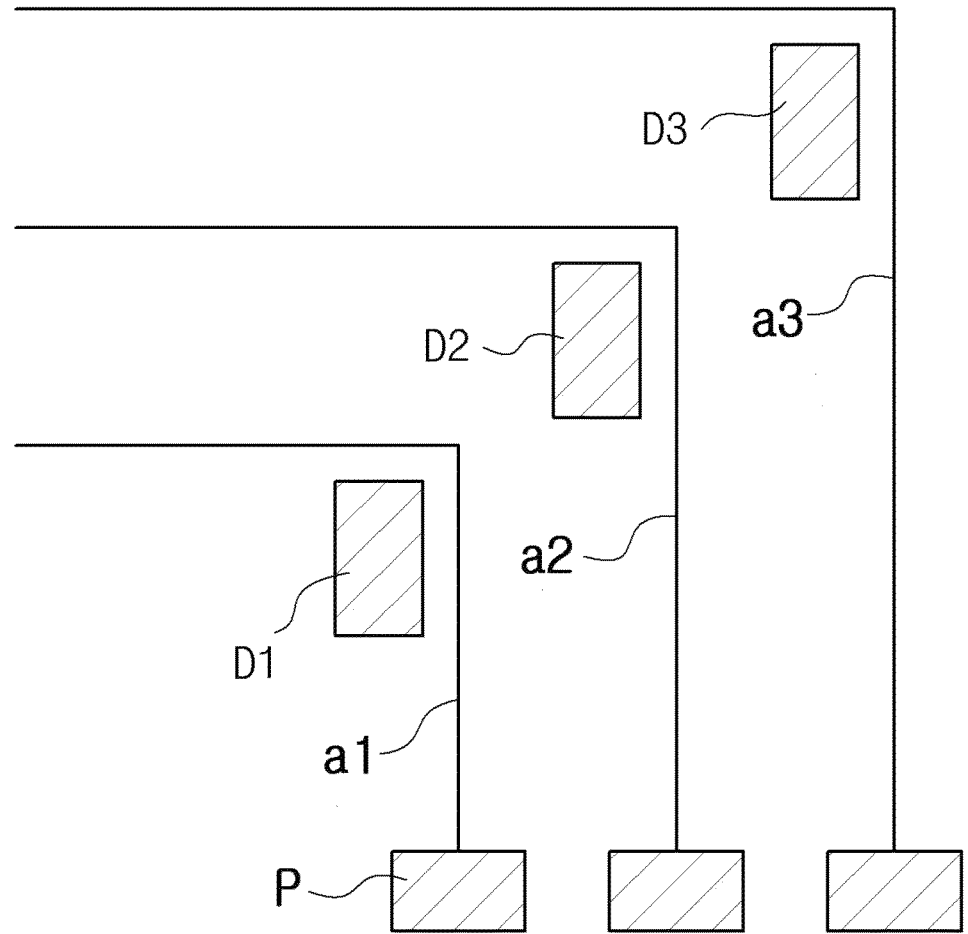

Referring to FIG. 2 and FIG. 5, the dummy circuit patterns D1, D2 and D3 may be formed at a space between the wirings of the bending position which forms the second wiring part and the connection pad P in FIG. 2. In particular, this is because in the case of the wiring pattern having a bending shape, many printing defects are generated and the increase in line width is remarkable.

The dummy circuit patterns according to the present invention may be disposed at an outermost angle of the wiring part or the bending position where the connection pad is formed. In addition to this, a second dummy circuit pattern may be implemented between each wiring (an inner wiring part), namely, between a number of wiring parts inside the wiring part of the outermost angle.

As described above, the existence of the dummy circuit patterns raises the effect capable of improving emotional quality of printing of the wiring part.

Furthermore, the dummy circuit patterns according to the present invention may be formed of the same material as that for forming the aforesaid wiring parts. In particular, a conductive material may be used for the material. Even when a material other than the conductive material is used, it would be efficient for insulating properties, but in order to improve printing properties, the same material as the wiring part may be used.

The touch window in which the aforesaid dummy circuit patterns according to the present invention are implemented may be applied to the following structure.

Figure 6:
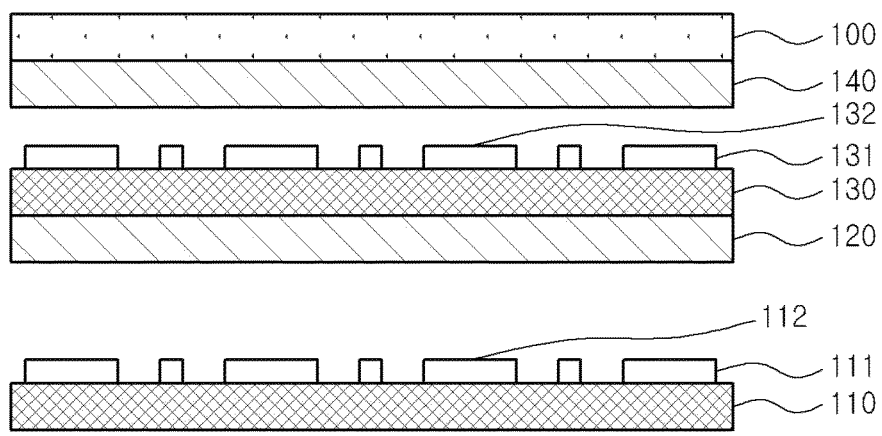
FIGS. 6 to 8 are cross-sectional concept views illustrating a structure of a touch window according to the present invention.

As illustrated in FIG. 6, the touch window according to the present invention may be configured to comprise: a sensing electrode pattern layer formed on a transparent window and including sensing electrodes which are patterned; wiring parts connected to the sensing electrodes, wherein the touch window further comprises dummy circuit patterns spaced apart from the wiring parts. The sensing electrode pattern layer may include: base substrates 130 and 110; and sensing electrodes 132 and 112 patterned on one surface of the base substrate or other surface opposed to the one surface. That is, the sensing electrode pattern layer may further include: a first sensing electrode pattern layer bonded to the transparent window via the first adhesive material layer and having a sensing electrode pattern on one surface; and a second sensing electrode pattern layer bonded to other surface of the first sensing electrode pattern layer via a second adhesive material layer, and having a sensing electrode pattern on one surface.

Figure 7:
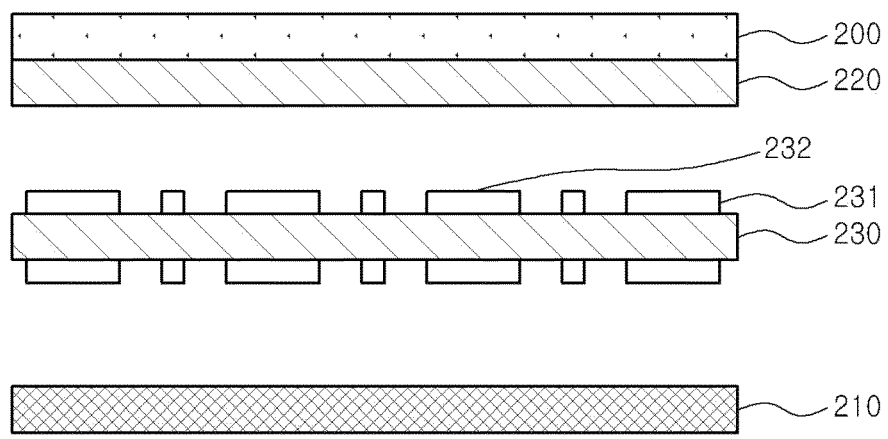

Unlike the structure illustrated in FIG. 6, but like the structure illustrated in FIG. 7, a sensing electrode 232 pattern may be formed on both surfaces of a base substrate 230. That is, in view of the fact that a double-sided sensing electrode is formed by a double-sided ITO substrate, the configuration is different from that of FIG. 6. The remaining configurations are identical with those of FIG. 6. Moreover, a protective film 210 for protecting the sensing electrode pattern of a lower surface of the base substrate 230 may be further provided.

Unlike the configuration of FIGS. 6 and 7 wherein the sensing electrode pattern layer is formed on the same plane as a separate base substrate 310, a transparent window 300 is formed, a sensing electrode pattern 312 is patterned on a cross section of the base substrate 310, and a wiring part 311 is simultaneously formed with the sensing electrode pattern. A first sensing electrode pattern and a second sensing electrode pattern are implemented on the same plane as each other. A first sensing electrode layer for determining a first axis (for example, an X axis) component of a contact may be patterned on one surface and a second sensing electrode layer for determining a second axis (for example, a Y axis) component of a contact may be patterned by implementing a disposition in which the second sensing electrode layer is insulated from the first sensing electrode layer. Furthermore, without the base substrate 310, the sensing electrode pattern may be directly formed on one surface of the transparent window 300 through deposition and coating processes.

In addition to some exemplary embodiments according to the touch window having various structures as described above, which is capable of improving printing quality of the wiring part through the dummy circuit pattern as the characteristic gist of the present invention, other exemplary embodiments may be also implemented by structures in which the pattern of the sensing electrode itself connected to the wiring part is varied.

Figure 8:
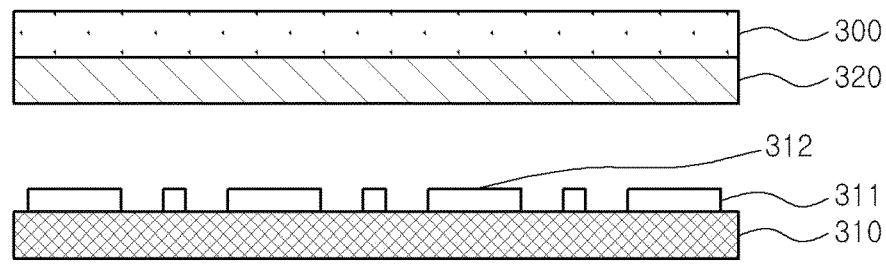
Figure 9:
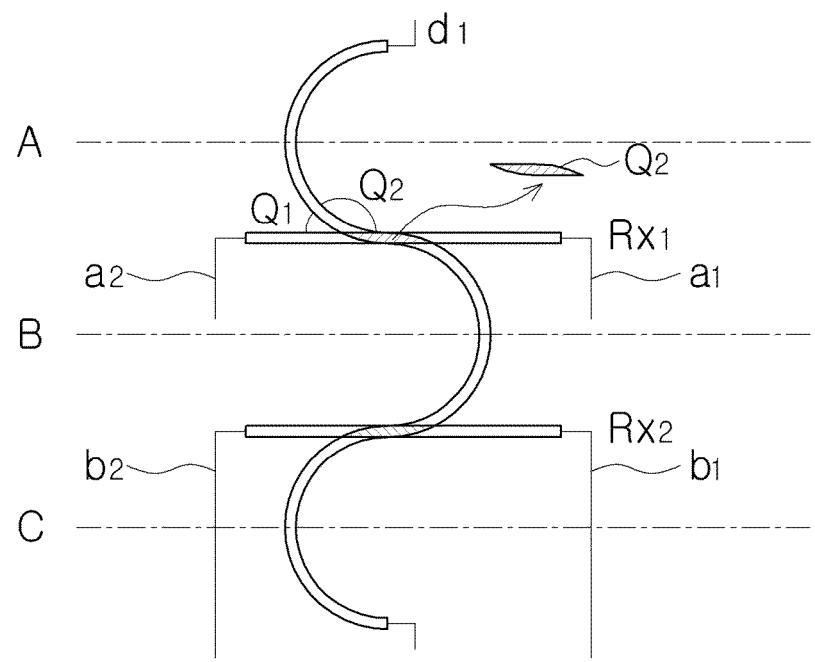
FIGS. 9 and 10 diagrams illustrating a structure of a sensing electrode pattern layer according to the present invention.

That is, like the structure of FIG. 9, the pattern of the sensing electrode formed in the structures of FIGS. 6 to 8 may be implemented.

In the structures of the touch window of FIGS. 6 to 8, when the first sensing electrode pattern and the second electrode pattern disposed to be spaced apart from each other are implemented to overlap each other, one of the sensing electrode patterns may be implemented as a curvature pattern.

That is, the sensing electrode pattern layer according to in an exemplary embodiment may be configured in such a manner that two sensing electrode pattern layers are disposed to be spaced apart from each other in opposite directions, shapes of the disposed patterns overlap each other, and one of the patterns has a curvature having fixed periodicity.

As illustrated in FIG. 9, the first sensing electrode pattern Tx1 may have a curvature pattern with fixed periodicity and the second sensing electrode pattern Rx1 may be formed in a linear type to be spaced apart from the first sensing electrode pattern. That is, in the structure of FIG. 6, the first sensing electrode pattern 132 and the second sensing electrode pattern 112 are formed on base members 130 and 110 different from each other, respectively to be spaced apart from each other. However, on the plane seen from above, the first sensing electrode pattern 132 has a structure in which the curvature pattern is formed and the second sensing electrode pattern 112 is formed in a linear type. Thus, a region (Q2 of FIG. 9) where the patterns overlap each other may be formed in a shape other than a rectangular shape or a square shape to be larger than the cross structure of a general linear type pattern.

In this case, the curvature pattern is defined as including all patterns which have fixed periodicity, and crest and trough shapes, but which are not a linear type. As illustrated in FIG. 8, a sine type curvature pattern or a cosine type curvature pattern in which the crests and troughs S1, S2 and S3 are periodically repeated may be provided. In addition to this structure, the curvature pattern may be formed in a structure in which zigzag type linear bendings are periodically repeated. The line segments A and B of FIG. 9 are imaginary line segments which pass through the peak of the crests and troughs of each curvature pattern.

In particular, the curvature pattern having periodicity may be formed in a structure in which the sensing electrode pattern in a linear type is disposed between an n curvature part and a (n+1) curvature part (n presents a natural number of more than 1.) Referring to the structure illustrated in FIG. 9, the second sensing electrode pattern Rx1 in a linear type is disposed between a first curvature part S1 and a second curvature part S2 of the first sensing electrode pattern Tx1. As one example, this exemplary embodiment shows a case that the first sensing electrode pattern is a curvature pattern. However, on the contrary to this, the first sensing electrode pattern may be implemented as a linear pattern and the second sensing electrode pattern may be implemented as a curvature pattern. Moreover, angles $\theta_1$ and $\theta_2$ in which the sensing electrode pattern Tx1 and the second sensing electrode pattern Rx1 overlap each other may be formed as an acute angle or an obtuse angle rather than a right angle. Moreover, preferably, in the case where the curvature pattern according to the present invention has sine type or cosine type periodicity, the second sensing electrode pattern may be formed to pass through and cross a ½ position of the first curvature part and the second curvature part, namely, the position of an inflection point. This disposition structure realizes the effect that a touch sensing efficient can be improved by maximizing a cross area Q2 and visibility can be improved by making optical properties clearer than that of the disposition of a conventional cross structure.

In the structure illustrated in FIGS. 6 to 8, the first and second adhesive insulation layers may be an OCA film. The first and second sensing electrode pattern layers may include the sensing electrode patterns which are formed of one selected from indium tin oxide (ITO), indium zinc oxide (IZO), zinc oxide (ZnO), carbon nanotubes (CNT), Ag nanowires, conductive polymers, or grapheme on the base member.

Unlike the aforesaid structure, wiring parts 111 and 131 for connecting the second and first sensing electrode patterns 112 and 132, respectively are formed, and the process of simultaneously forming the wiring parts and the sensing electrode patterns using a conductive material such as Ag, Al, Cu rather than using a transparent electrode material may be used. This can solve the problems in that when a pattern of the electrode is formed using an ITO material, a shape of the pattern is seen, in that the production cost increases due to the ITO material that is an expensive material, and in that it would be difficult to realize a structure having a double-sided ITO material layer on a single base substrate due to the degradation in film hardness of the ITO material. Accordingly, it is advantageous that the production cost is reduced by the process of simultaneously forming a valid part and the wiring part by forming and patterning the conductive material instead of the ITO material on an optical member, and that the process capable of realizing the freedom of various designs regardless of the degradation in film hardness is provided.

Figure 10:
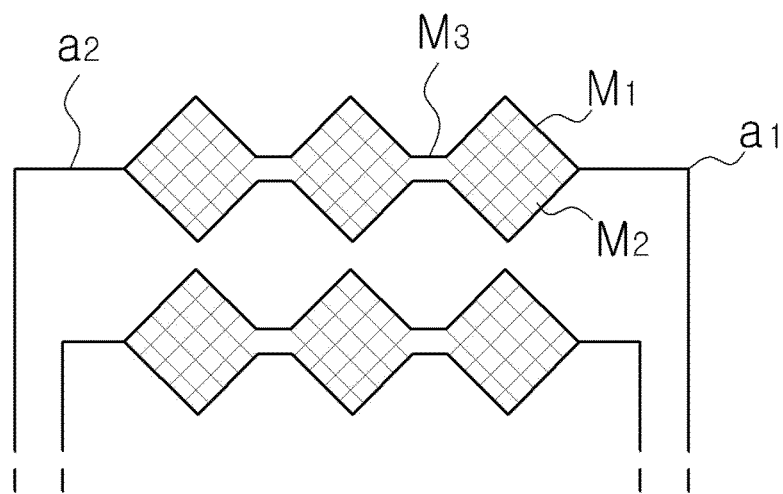

As illustrated in FIG. 10, the pattern structure of the sensing electrode may be implemented in a mesh type structure.

That is, in the structure of the touch window illustrated in FIGS. 6 to 8, the sensing electrode may be formed in a structure in which a number of unit patterns are connected and may have a double routing structure in which wiring parts a1 and a2 are connected to both ends of each sensing electrode, respectively. In particular, it is characterized in that the unit patterns are formed in a mesh structure. In this exemplary embodiment, the mesh structure is defined as a structure that includes an external line pattern M1 for forming an exterior angle part of the unit patterns and an internal line pattern M2 for connecting an inside of the external line pattern in a cross structure. In particular, the external line pattern M1 may be implemented in various shapes such as a circular shape and an elliptical shape as well as a polygonal shape and may be formed of a conductive material in a line shape.

Furthermore, as illustrated, the internal line pattern M2 may be formed by the collection of lines for connecting the inside of the external line pattern M1 in a cross structure. That is, the number of patterns having a linear structure may be formed in a net structure to cross each other. Of course, the disposition in various curved structures as well as a straight-line structure may be also applied. The sensing electrode of the mesh structure according to the present invention may transmit an electrical signal by forming lines continued by a conductive material of 3 μm-10 μm in a polygonal mesh shape. In the case, signal transmission efficiency can be largely increased by controlling a line width and a cross angle in the cross structure of the internal pattern line M2 in the mesh structure. Moreover, the process of simultaneously producing the wiring part and the sensing electrode pattern with the same material as each other is implemented, thereby being capable of increasing process efficiency. In addition to, because the ITO material is not used, the process cost can be largely reduced. Accordingly, the signal transmission efficiency resulting from the reduction of a material cost and a process cost is improved by the mesh structure, thereby realizing a product of high efficiency. Various materials such as Ag, Cu, Al may be applied to the conductive material used for the wiring and the sensing electrode used in the present invention.

That is, in the structure of FIG. 6 as one example, an electrode is not formed using a transparent electrode material, but with regard to the wiring parts 111 and 131 for connecting the second and first sensing electrode patterns 112 and 132, respectively, the process of simultaneously forming the wiring part and the sensing electrode pattern using the conductive material such as Ag, Al and Cu may be used. This can solve the problems in that when a pattern of the electrode is formed using an ITO material, a shape of the pattern is seen and the production cost increases due to the ITO material that is an expensive material, and in that it would be difficult to realize a structure which has a double-sided ITO material layer on both surface of the single base substrate due to the degradation in film hardness of the ITO material. Thus, it is advantageous that the production cost is reduced by the process of simultaneously forming a valid part and the wiring part by forming and patterning the conductive material instead of the ITO material on the optical member, and that the process capable of realizing the freedom of various designs regardless of the degradation in film hardness is provided. In this case, the dummy circuit patterns according to the present invention may be also implemented using the same material.

Moreover, as previously described as additional features and as illustrated in FIG. 9, each wiring part is connected to each both end of the unit sensing electrode patterns Rx1 and Rx2 which form various sensing electrode pattern layers. That is, unit wiring parts a1 and a2 are connected to both ends of Rx1, and unit wiring parts b1 and b2 are connected to both ends of Rx2. That is, a structure in which the unit wiring parts are connected to both ends of each unit sensing electrode, respectively is provided so that both sides of a sensing area have wirings, thereby being capable of improving a sensing capacity by reducing the charge time of electrodes for sensing.

In the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A touch window, comprising:
   first sensing electrodes on a substrate;
   wiring parts connected to the first sensing electrodes;
   connection pads connected to the wiring parts; and
   at least one first dummy circuit pattern spaced apart from and electrically insulated from the connection pads;
   wherein the at least one first dummy circuit pattern is spaced between outermost wirings of the wiring parts, and at least two first dummy circuit patterns are disposed in a space closer to the outermost wirings of the wiring parts that are parallel to a closest edge of the touch window than to the connection pads.

2. The touch window of claim 1, further comprising a second dummy circuit pattern disposed between wirings included in the wiring parts.

3. The touch window of claim 2, wherein the second dummy circuit pattern is disposed in a space closer to a bending part of a second wiring of the wiring parts than to a first wiring of the wiring parts.

4. The touch window of claim 1, wherein the first sensing electrodes and the wiring parts are formed of a same material.

5. The touch window of claim 4, wherein the first sensing electrodes and the wiring parts are formed of a conductive material.

6. The touch window of claim 1, wherein the at least one first dummy circuit pattern is formed of a same material as that of the wiring parts.

7. The touch window of claim 1, further comprising second sensing electrodes on a first side of the substrate opposite to a second side of the substrate that the first sensing electrodes are disposed on.

8. The touch window of claim 1, further comprising a base substrate bonded to the substrate via a layer of adhesive material; and
   second sensing electrodes on the base substrate.

9. The touch window of claim 8, wherein the first sensing electrodes or the second sensing electrodes are formed in a plurality of units of pattern in mesh structures, each unit of pattern with a mesh structure including an external line pattern forming an outer angle part and an internal line pattern connecting an interior of the external line pattern in a cross structure.

10. The touch window of claim 9, wherein the first sensing electrodes and the second sensing electrodes are disposed to partially overlap each other, and each of the first sensing electrodes and the second sensing electrodes has a curvature part that is repeated periodically to form a curvature pattern.

11. The touch window of claim 10, wherein the curvature pattern with periodicity is configured such that a linear sensing electrode is disposed between two neighboring curvature parts of the curvature pattern.

12. The touch window of claim 1, further comprising second sensing electrodes on the substrate, wherein the second sensing electrodes are insulated from the first sensing electrodes, and wherein the substrate is a transparent.

13. The touch window of claim 1, further comprising second sensing electrodes on the substrate wherein the second sensing electrodes are insulated from the first sensing electrodes, and
   a transparent panel bonded to the substrate via a layer of adhesive material.

14. The touch window of claim 1, wherein the first sensing electrodes are formed of indium-tin oxide (ITO), indium zinc oxide (IZO), zinc oxide (ZnO), carbon nanotubes (CNT), Ag nanowires, conductive polymers, or graphene.

15. The touch window of claim 1, wherein the at least one first dummy circuit pattern is disposed between the outermost wirings of the wiring parts that are parallel to the closest edge of the touch window and the connection pads connected to a wiring adjacent to the outermost wirings; and
   wherein the connection pads are spaced apart from the outermost wirings.

16. The touch window of claim 1, wherein the at least one first dummy circuit pattern is disposed between at least one of the wiring parts and at least one of the connection pads.

17. The touch window of claim 1, wherein the at least one first dummy circuit pattern is spaced apart from and electrically insulated from the wiring parts.

* * * * *